(12) United States Patent
Ha (10) Patent No.: US 7,227,800 B2
(45) Date of Patent: Jun. 5, 2007

(54) NOISE SUPPRESSION IN MEMORY DEVICE SENSING

(75) Inventor: Chang Wan Ha, San Ramon, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/416,679

(22) Filed: May 3, 2006

(65) Prior Publication Data

US 2006/0198194 A1 Sep. 7, 2006

Related U.S. Application Data

(63) Continuation of application No. 10/932,963, filed on Sep. 2, 2004, now Pat. No. 7,079,434.

(51) Int. Cl.
*G11C 7/00* (2006.01)

(52) U.S. Cl. ............... 365/205; 365/207; 365/185.17

(58) Field of Classification Search ............... 365/205, 365/207, 185.17
See application file for complete search history.

(56) References Cited

U.S. PATENT DOCUMENTS

| | | | |
|---|---|---|---|
| 5,508,965 A | 4/1996 | Nomura | |
| 5,553,029 A | 9/1996 | Reohr | |
| 5,627,789 A | 5/1997 | Kalb, Jr. | |
| 5,757,696 A | 5/1998 | Matsuo et al. | |
| 5,852,580 A | 12/1998 | Ha | |
| 5,920,223 A | 7/1999 | Johnson | |
| 5,995,440 A | 11/1999 | Lewis | |
| 6,021,067 A | 2/2000 | Ha | |
| 6,212,109 B1 * | 4/2001 | Proebsting | ............ 365/189.01 |
| 6,477,100 B2 * | 11/2002 | Takemura et al. | .......... 365/207 |
| 6,507,525 B1 * | 1/2003 | Nobunaga et al. | .......... 365/203 |
| 6,584,035 B2 | 6/2003 | Di Iorio | |

* cited by examiner

*Primary Examiner*—Tuan T. Nguyen
(74) *Attorney, Agent, or Firm*—Leffert Jay & Polglaze, P.A.

(57) ABSTRACT

NAND memory devices utilize sensing devices for sensing a programmed state of a nonvolatile memory cell or writing a data value to a nonvolatile memory cell. Latches in sensing devices are selectively coupled to a variable-potential node to receive a first potential to switch the latch, i.e., presetting, setting or resetting the latch. After switching, the variable-potential node may be set to an intermediate potential to increase noise immunity to the latch while holding the data value. In NAND sensing devices having a data latch and a cache latch, the variable-potential nodes of the data latch and the variable-potential nodes of the cache latch are coupled to separate ground control circuits. By independently varying the potentials applied to the variable-potential nodes of the data latch and cache latch, determined by whether the individual latch is switching or holding data, noise immunity in the data path is increased.

47 Claims, 6 Drawing Sheets

NOISE SUPPRESSION IN MEMORY DEVICE SENSING

RELATED APPLICATION

This application is a Continuation of U.S. application Ser. No. 10/932,963 titled "NOISE SUPPRESSION IN MEMORY DEVICE SENSING," filed Sep. 2, 2004, now U.S. Pat 7,079,434 (allowed) which is commonly assigned and incorporated herein by reference.

TECHNICAL FIELD OF THE INVENTION

The present invention relates generally to semiconductor memory devices, and in particular, the present invention relates to sensing and sense amplifiers in a NAND flash memory device.

BACKGROUND OF THE INVENTION

Semiconductor memory devices are rapidly-accessible memory devices. In a semiconductor memory device, the time required for storing and retrieving information generally is independent of the physical location of the information within the memory device. Semiconductor memory devices typically store information in a large array of cells. A group of cells are electrically connected together by a bit line, or data line. An electrical signal is used to program a cell or cells.

Computer, communication and industrial applications are driving the demand for memory devices in a variety of electronic systems. One important form of semiconductor memory device includes a non-volatile memory made up of floating-gate memory cells called flash memory. Computer applications use flash memory to store BIOS firmware. Peripheral devices such as printers store fonts and forms on flash memory. Digital cellular and wireless applications consume large quantities of flash memory and are continually pushing for lower voltages and power demands. Portable applications such as digital cameras, audio recorders, personal digital assistants (PDAs) and test equipment also use flash memory as a medium to store data.

Data values stored in memory cells are sensed in order to provide the data to an external device, such as a processor or memory controller. In a sensing operation, a read voltage is applied to a control gate of a memory cell and the cell is coupled to a sensing device. In a first state, the memory cell will activate or become conductive. This is often referred to as an erased state and often corresponds to a data value of 1. In a second state, the memory cell will not activate in response to the read voltage and will remain essentially nonconductive. This is often referred to as a programmed state and often corresponds to a data value of 0. The differences in the states of the memory cell are dependent upon the nature of the cell, but generally result from differences in threshold voltage (Vt) of a field-effect transistor. One example includes the addition or removal of charge from a floating gate of a floating-gate memory cell or a trapping layer of an NROM cell. Another example includes the alteration of the remanent polarization of a ferroelectric layer in a ferroelectric memory cell. Other nonvolatile memory cells are also known in the art whose data value is indicated by the threshold voltage of a transistor.

In flash memory, and NAND flash memory in particular, sensed data is latched for page read-out. This latched data should store the data value while data is transferring to an output pin of the device. When switching an output buffer, however, ground noise and power noise is often generated. This is especially true when the output data is changing from one logic level to the other, e.g., high to low or low to high. Noise propagating to the internal circuits of the memory device can create malfunctions, leading to data errors or worse.

NAND sensing devices typically include two latches for holding sensed data, i.e., a data latch and a cache latch, because sensing times are typically much longer than those seen with NOR memory. For example, NAND sensing times may be on the order of 10–20 µs while NOR sensing times may be on the order of 55–90 ns. Sensed data is latched in the data latch and then passed to the cache latch. While reading data from the cache latch, the data latch can be used to latch a data value from the next addressed memory page. In this manner, the relatively slow sensing times can be hidden from a user when reading several consecutive pages.

For the reasons stated above, and for other reasons stated below which will become apparent to those skilled in the art upon reading and understanding the present specification, there is a need in the art for alternative sensing devices for integrated-circuit memory devices, memory devices containing such sensing devices, and methods of their operation.

DETAILED DESCRIPTION OF THE INVENTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The following detailed description is, therefore, not to be taken in a limiting sense, and the scope of the present invention is defined only by the appended claims and equivalents thereof.

Sensing circuitry in accordance with the various embodiments are adaptable for a variety of memory devices, including flash memory devices and especially NAND flash memory devices.

Figure 1:
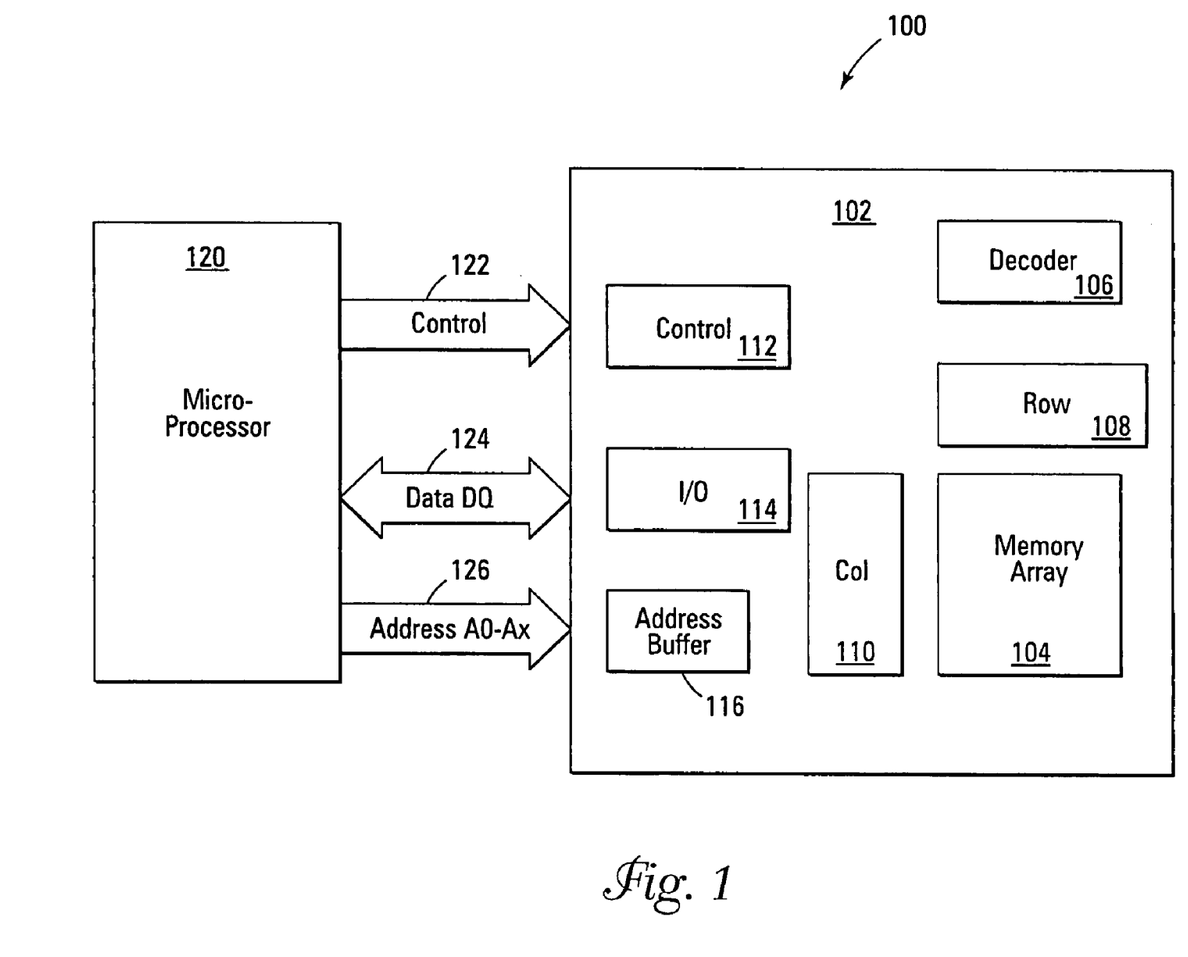
FIG. 1 is a simplified block diagram of a memory system, according to an embodiment of the invention.

FIG. 1 is a simplified block diagram of a memory system 100, according to an embodiment of the invention. Memory system 100 includes an integrated circuit flash memory device 102, e.g., a NAND memory device, that includes an array of flash memory cells 104, an address decoder 106, row access circuitry 108, column access circuitry 110, control circuitry 112, Input/Output (I/O) circuitry 114, and an address buffer 116. Memory system 100 includes an external microprocessor 120, or memory controller, electrically connected to memory device 102 for memory accessing as part of an electronic system. The memory device 102 receives control signals from the processor 120 over a control link 122. The memory cells are used to store data that are accessed via a data (DQ) link 124. Address signals are received via an address link 126 that are decoded at address decoder 106 to access the memory array 104. Address buffer circuit 116 latches the address signals. The memory cells are accessed in response to the control signals and the address signals. It will be appreciated by those skilled in the art that additional circuitry and control signals can be provided, and that the memory device of FIG. 1 has been simplified to help focus on the invention.

Figure 2:
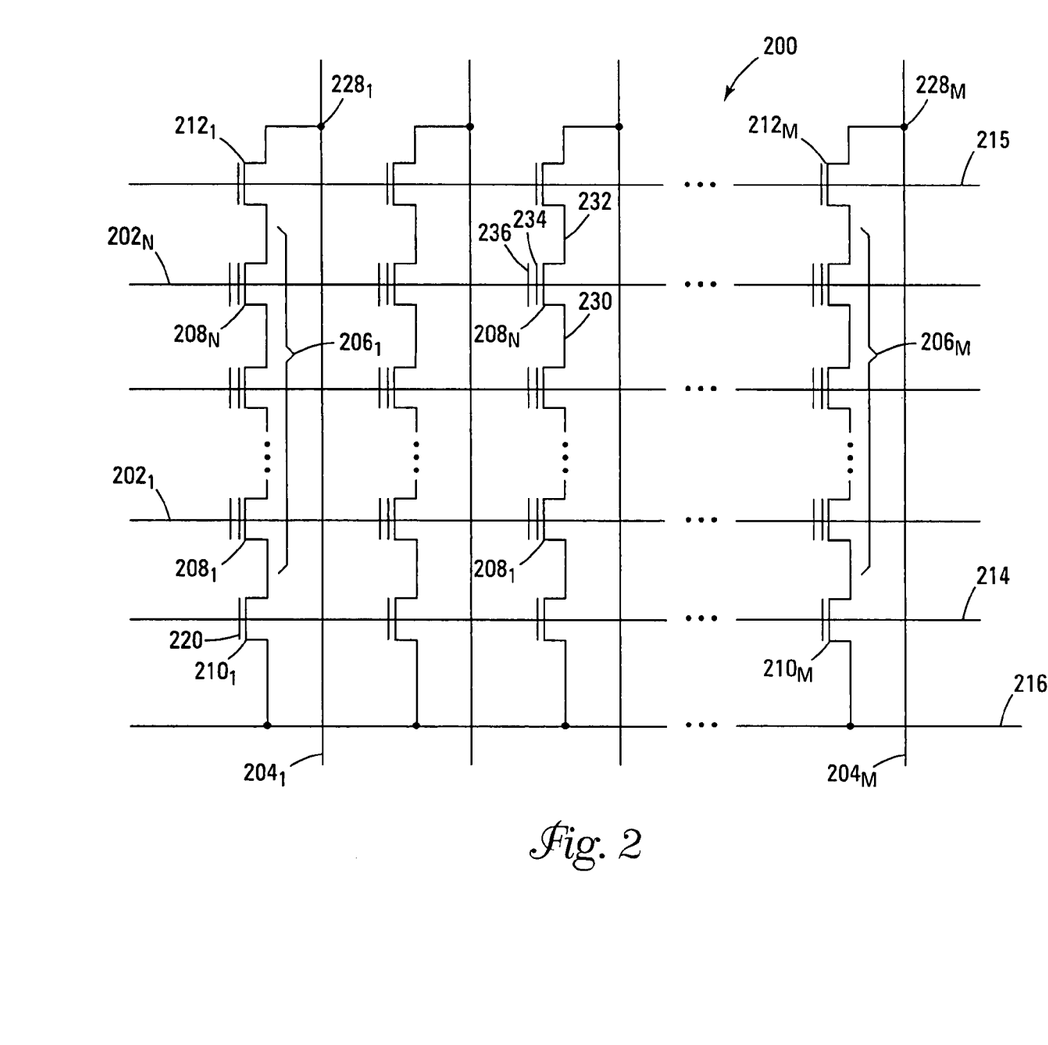
FIG. 2 is a schematic of a NAND memory array, according to another embodiment of the invention.

FIG. 2 is a schematic of a NAND memory array 200 as a portion of memory array 104 in accordance with another embodiment of the invention. As shown in FIG. 2, the memory array 200 includes word lines $202_1$ to $202_N$ and intersecting local bit lines $204_1$ to $204_M$. For ease of addressing in the digital environment, the number of word lines 202 and the number of bit lines 204 are each some power of two, e.g., 256 word lines 202 by 4,096 bit lines 204. The local bit lines 204 are coupled to global bit lines (not shown) in a many-to-one relationship.

Memory array 200 includes NAND strings $206_1$ to $206_M$. Each NAND string includes floating-gate transistors $208_1$ to $208_N$, each located at an intersection of a word line 202 and a local bit line 204. The floating-gate transistors 208 represent non-volatile memory cells for storage of data. The floating-gate transistors 208 of each NAND string 206 are connected in series source to drain between a source select line 214 and a drain select line 215. Source select line 214 includes a source select gate 210, e.g., a field-effect transistor (FET), at each intersection between a NAND string 206 and source select line 214, and drain select line 215 includes a drain select gate 212, e.g., a field-effect transistor (FET), at each intersection between a NAND string 206 and drain select line 215. In this way, the floating-gate transistors 208 of each NAND string 206 are connected between a source select gate 210 and a drain select gate 212.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. Each source select gate 210 includes a control gate 220.

The drain of each drain select gate 212 is connected to the local bit line 204 for the corresponding NAND string at a drain contact 228. For example, the drain of drain select gate $212_1$ is connected to the local bit line $204_1$ for the corresponding NAND string $206_1$ at drain contact $228_1$. The source of each drain select gate 212 is connected to the drain of the last floating-gate transistor $208_N$ of the corresponding NAND string 206. For example, the source of drain select gate $212_1$ is connected to the drain of floating-gate transistor $208_N$ of the corresponding NAND string $206_1$.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of memory array 200 includes a NAND string 206 and the source and drain select gates connected thereto. A row of the floating-gate transistors 208 are those transistors commonly coupled to a given word line 202.

Figure 3:
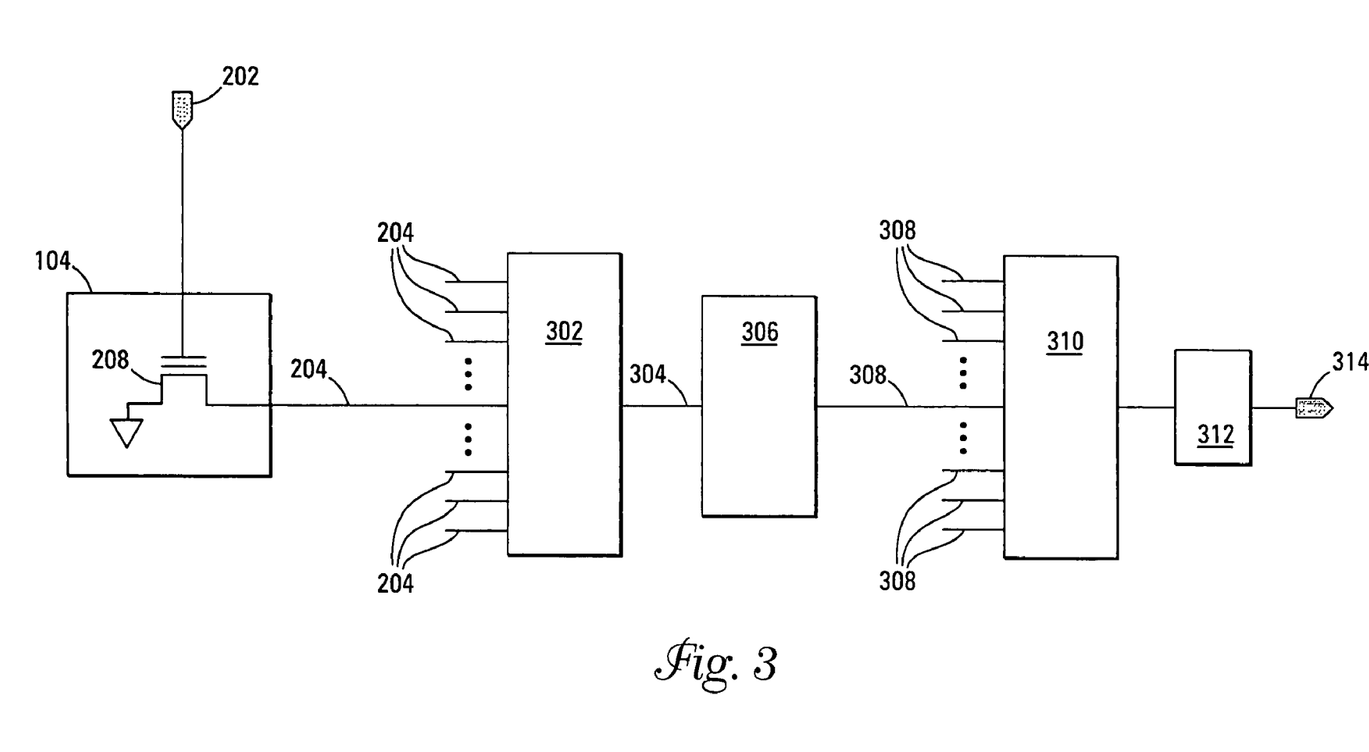
FIG. 3 is a schematic of a portion of a memory device having sensing circuitry in accordance with the invention.

FIG. 3 is a schematic of a portion of a memory device having a sensing circuit in accordance with the invention. Because memory devices typically contain millions, if not billions, of memory cells, it is common to have multiple layers of multiplexing in coupling a memory cell to a DQ line of the memory device. FIG. 3 demonstrates one example of how such multiplexing can be used to provide an indication of a data value of a target memory cell to an external device.

As shown in FIG. 3, a target memory cell 208 as part of a memory array 200 is selectively coupled to a first multiplexer 302 through its associated local bit line 204, along with local bit lines 204 from a number of other non-selected memory cells (not shown in FIG. 3). As one example, for a memory array 200 of the type depicted in FIG. 2, a target memory cell 208 would be selectively coupled to the first multiplexer 302 upon activation of its word line 202 and an associated drain select gate (not shown in FIG. 3). The first multiplexer 302 is configured to select one of a plurality of local bit lines in response to an address decoder (not shown in FIG. 3) and couple it to an output, or global bit line, 304. It will be apparent that other memory array configurations, such as NOR configurations, are also suitable for use with the invention.

The global bit line 304 is provided to a sensing device 306 in accordance with an embodiment of the invention. The sensing device 306 senses the data value of the target memory cell 208 and provides a signal indicative of its data value on its output 308. The output 308 of sensing device 306 is then provided to a second multiplexer 310 along with other outputs 308 from other sensing devices (not shown in FIG. 3). The second multiplexer 310 is configured to select one of a plurality of outputs 308 in response to an address decoder (not shown in FIG. 3) and couple it to an output driver 312 to place the data signal on the output 314, such as a DQ line, of the memory device. Often, the output 308 includes two data signals, i.e., the data value and its binary complement.

Figure 4:
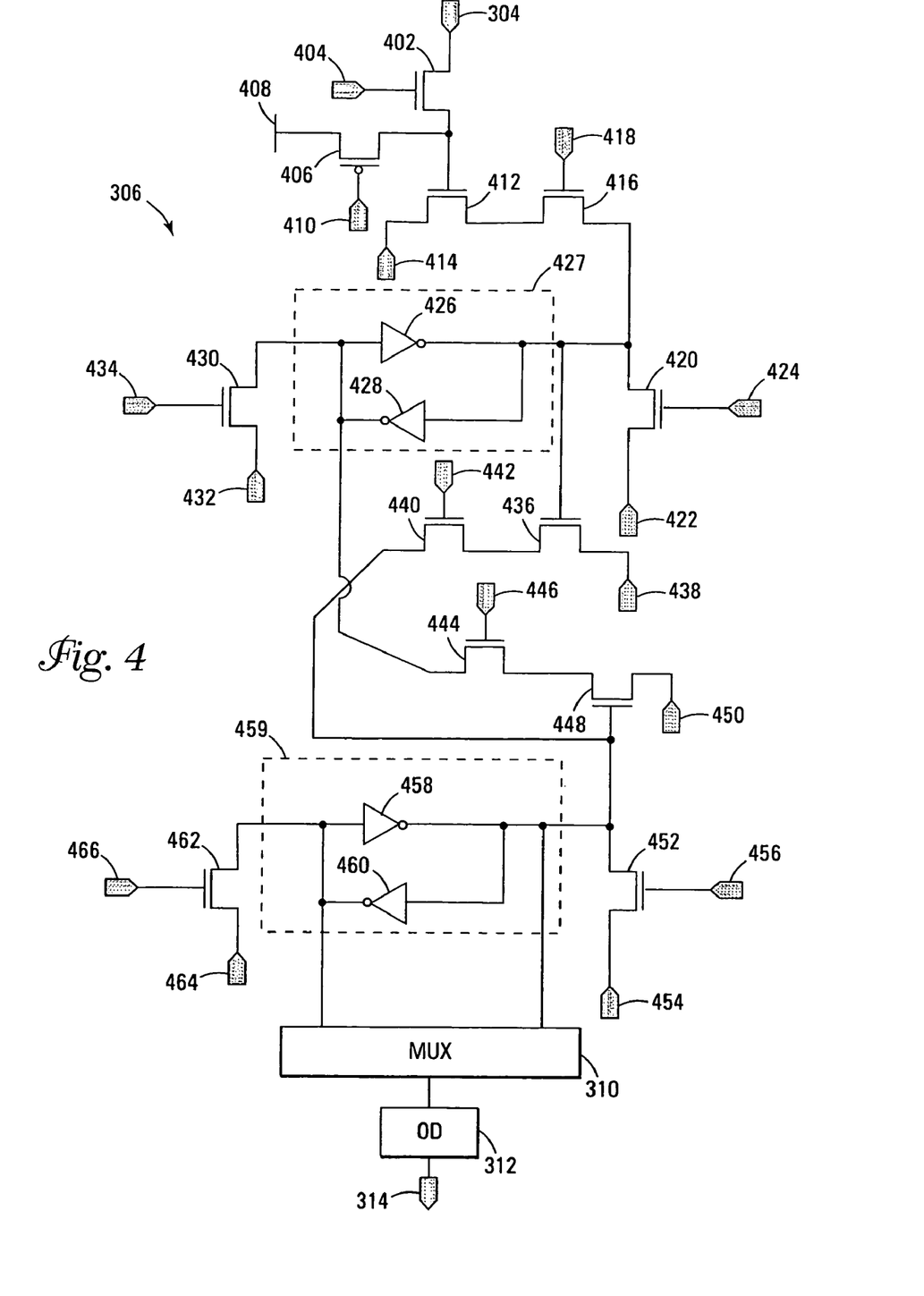
FIG. 4 is a schematic of a sensing device in accordance with an embodiment of the invention.

FIG. 4 is a schematic of a sensing device 306 for demonstrating noise suppression using embodiments of the invention. Other sensing devices are known and can benefit from the embodiments of the invention as described herein. The sensing device 306 is selectively coupled to a global bit line 304 through a select transistor, such as an n-type field effect transistor (nFET) 402. The select nFET 402 is responsive to a control signal received at node 404, which is coupled to the gate of the nFET 402. The sensing device 306 has a first latch or data latch 427 and a second latch or cache latch 459 that are isolated from one another. Passing of data values from one latch to the other is accomplished by utilizing the data value of one latch to selectively couple an input of the other latch to a potential node. Although the embodiment depicted in FIG. 4 utilizes ground potentials to pass the data value, it will be apparent that the same concepts could be used to pass the data value using selective coupling to supply potentials.

Sensing of the data value of a target memory cell is performed by coupling the target memory cell to the global bit line 304 and coupling the global bit line 304 to the gate of a transistor. The transistor is preferably an nFET device, such as nFET 412 having its source coupled to a variable-potential node 414 for receiving a first potential during switching and for receiving an intermediate potential during a holding period. For one embodiment, the first potential is a ground potential, e.g., Vss, and the intermediate potential is a supply potential, e.g., Vcc, minus one Vt. For quick and accurate sensing, this device should be relatively strong compared to the devices forming latches of the sensing device 306. For one embodiment, the sensing nFET 412 has a W/L ratio of 15/2. Precharging of the gate of sensing nFET 412 is provided through p-type field effect transistor (pFET) 406 having a source coupled to a supply node 408 to receive a supply potential, such as Vcc, and a gate coupled to receive a control signal at node 410.

The drain of the sensing nFET 412 is selectively coupled to a data latch 427 through a sense enable switch, or nFET 416. For one embodiment, the data latch 427 includes a pair of cross-coupled inverters 426 and 428 with the input of inverter 428 coupled to the drain of nFET 416 and the output of inverter 426, and the output of inverter 428 coupled to the input of inverter 426. The nFET 416 has its gate coupled to receive an enable signal at node 418.

A reset transistor, nFET 420, has a drain coupled to an input of the inverter 428, a source coupled to a variable-potential node 422 and a gate coupled to receive a reset control signal at node 424. The variable-potential node 422 is coupled to receive the same potential as the variable-potential node 414. A preset transistor, nFET 430, has a drain coupled to an input of the inverter 426, a source coupled to a variable-potential node 432 and a gate coupled to receive a preset control signal at node 434. The variable-potential node 432 is coupled to receive the same potential as the variable-potential node 414.

The value latched in data latch 427 may be provided to cache latch 459 by using it to selectively activate a transistor, such as nFET 436. This is desirable when reading a data value of the target memory cell to allow the data value to proceed to the DQ line 314 while a subsequent target memory cell is sensed. The nFET 436 has its gate coupled to the output of inverter 426, its source coupled to a variable-potential node 438 and its drain selectively coupled to the cache latch 459 through a pass transistor, such as nFET 440. Variable-potential node 438 is coupled to receive a first potential during switching and to receive an intermediate potential during a holding period. For one embodiment, the first potential is a ground potential, e.g., Vss, and the intermediate potential is a supply potential, e.g., Vcc, minus one Vt. While the variable-potential node 438 may be coupled to receive the same potential levels as the variable-potential nodes 414, 422, 432 and 450, it will receive its respective potential levels at different times as the data latch 427 and cache latch 459 operate independently. The nFET 440 is responsive to a control signal received at node 442.

For one embodiment, the cache latch 459 includes a pair of cross-coupled inverters 458 and 460 with the input of inverter 460 coupled to the drain of nFET 440 and the output of inverter 458, and the output of inverter 460 coupled to the input of inverter 458.

A reset transistor, nFET 452, has a drain coupled to an input of the inverter 460, a source coupled to a variable-potential node 454 and a gate coupled to receive a reset control signal at node 456. The variable-potential node 454 is coupled to receive the same potential as the variable-potential node 438. A preset transistor, nFET 462, has a drain coupled to an input of the inverter 458, a source coupled to a variable-potential node 464 and a gate coupled to receive a preset control signal at node 466. The variable-potential node 464 is coupled to receive the same potential as the variable-potential node 438.

The value latched in cache latch 459 may be provided to a DQ line 314 of the memory device by coupling one or both outputs of the cross-coupled inverters 458 and 460 to a multiplexer 310, and providing the output of the multiplexer 310 to an output driver 312 coupled to the DQ line 314. Because cross-coupled inverters are typically configured using weak devices, e.g., having a W/L ratio of perhaps 10/8, it is desirable to buffer their outputs prior to providing them to the multiplexer 310. For example, inverters could be coupled between the outputs of the inverters 458/460 and the multiplexer 310 to buffer them from the multiplexer 310. For one embodiment, only one output of the cache latch 459, e.g., the output of inverter 458 or the output of inverter 460, is provided to multiplexer 310 as indicative of the data value.

The value latched in cache latch 459 may be provided to data latch 427 by using it to selectively activate a transistor, such as nFET 448. This is desirable when writing a data value to a target memory cell. The nFET 448 has its gate coupled to the output of inverter 458, its source coupled to a variable-potential node 450 and its drain selectively coupled to the data latch 427 through a pass transistor, such as nFET 444. The variable-potential node 450 is coupled to receive the same potential as the variable-potential node 414. The nFET 444 is responsive to a control signal received at node 446.

Data Read

In a read operation, the data latch 427 is preset by activating preset nFET 430 while its associated variable-potential nodes, i.e., nodes 414, 422, 432 and 450, are coupled to receive their first potentials. This forces the input of inverter 426 to a logic low and the input of inverter 428 to a logic high by coupling the input of inverter 426 to receive the ground potential at the variable-potential node 432. A target memory cell is coupled to its global bit line 304 and the gate of the sensing nFET 412 is precharged by activating pFET 406. Precharging the gate of the sensing nFET 412 will activate this transistor. The precharge transistor, pFET 406, may be left activated during sensing if its transconductance is sufficiently below that of an activated target memory cell. Alternatively, the pFET 406 may be deactivated once the target memory cell is coupled to the sensing nFET 412 upon activating the select nFET 402.

If the target memory cell is non-conductive, e.g., programmed with a first or logic low data value, the sensing nFET 412 will remain activated. By activating the enable nFET 416, the data latch 427 is then coupled to receive the ground potential at the variable-potential node 414. This in turn will flip the data latch 427. Conversely, if the target memory cell is conductive, e.g., programmed with a second or logic high data value, the sensing nFET 412 will turn off as the precharge is drained from its gate by the conductance of the target memory cell through bit line 304. In this situation, when enable nFET 416 is activated, the data latch 427 will remain at its preset state.

After sensing and latching the data value in data latch 427, the variable-potential nodes 414, 422, 432 and 450 may be coupled to receive their intermediate potentials. As can be seen from the example of FIG. 4, if the nodes 414, 422, 432 and 450 are coupled to receive an intermediate potential, such as Vcc-Vt, their associated nFETs 412, 420, 430 and 444, respectively, will not activate unless noise on their control gates reaches Vcc. Conversely, if the nodes 414, 422, 432 and 450 were coupled to receive Vss, they could be activated if ground noise on their control gates reached just one Vt. Thus, when these nFETs 412, 420, 430 or 448 are intended to be off and have a ground potential applied at their control gates, immunity to ground noise is increased when using the intermediate potential. The data value may be passed to the cache latch 459 to allow a subsequent read operation to be performed. To pass the data value to the cache latch 459, it is first preset by activating the preset nFET 462 while its associated variable-potential nodes 438, 454 and 464 are coupled to receive their first potentials. This will force the input of inverter 458 to a logic low and the input of inverter 460 to a logic high by coupling the input of inverter 458 to the variable-potential node 464. After presetting the cache latch 459, the input of inverter 460 is coupled to the drain of nFET 436 by activating pass nFET 440. If the output of inverter 426 is a logic high, nFET 436 will be activated, thus flipping the preset value of the cache latch 459 by forcing the input of inverter 460 to a logic low when it is coupled to the ground node 438. Conversely, if the output of inverter 426 is a logic low, nFET 436 will be deactivated, leaving the cache latch 459 in its preset state. Upon latching the data value in the cache latch 459, it may be made available to the DQ line 314 and the variable-potential nodes 438, 454 and 464 may be coupled to receive their intermediate potentials. As can be seen from the example of FIG. 4, if the nodes 438, 454 and 464 are coupled to receive an intermediate potential, such as Vcc-Vt, their associated nFETs 440, 452 and 462, respectively, will not activate unless noise on their control gates reaches Vcc. Conversely, if the nodes 438, 454 and 464 were coupled to receive Vss, they could be activated if ground noise on their control gates reached just one Vt. Thus, when these nFETs 440, 452 and 462 are intended to be off and have a ground potential applied at their control gates, immunity to ground noise is increased when using the intermediate potential.

Data Write

In a write operation, the cache latch 459 may optionally be reset by activating reset nFET 452 while its associated variable-potential nodes 438, 454 and 464 are coupled to receive their first potentials. This forces the input of inverter 460 to a logic low and the input of inverter 458 to a logic high by coupling the input of inverter 460 to the variable-potential node 454. The data value desired to be written to a target memory cell may be written to the cache latch 459, such as by providing a data signal to the input of inverter 458 or the input of inverter 460. Similarly, a data signal could be provided to the input of one of the inverters of cache latch 459 while the binary complement of the data signal is provided to the input of the other inverter of cache latch 459. After latching the data value in the cache latch 459, the variable-potential nodes 438, 454 and 464 may be coupled to receive their intermediate potentials.

Before passing the data value from the cache latch 459 to the data latch 427, the data latch 427 is first reset by activating reset nFET 420 while the variable-potential nodes 414, 422, 432 and 450 are coupled to receive their first potentials. This forces the input of inverter 428 to a logic low and the input of inverter 426 to a logic high by coupling the input of inverter 428 to the variable-potential node 422. After presetting the data latch 427, the input of inverter 426 is coupled to the drain of nFET 448 by activating pass nFET 444. If the output of inverter 458 is a logic high, nFET 448 will be activated, thus flipping the reset value of the data latch 427 by forcing the input of inverter 426 to a logic low when it is coupled to the ground node 450. Conversely, if the output of inverter 458 is a logic low, nFET 448 will be deactivated, leaving the data latch 427 in its reset state. Upon latching the data value in the data latch 427, the variable-potential nodes 414, 422, 432 and 450 may be coupled to receive their intermediate potentials and the data value may be made available to the global bit line 304 for programming the target memory cell by activating enable nFET 416, precharge pFET 406 and select nFET 402. Also, upon latching the data value in the data latch 427, the cache latch 459 is available to receive a subsequent data value for a subsequent read operation.

Figure 5A:
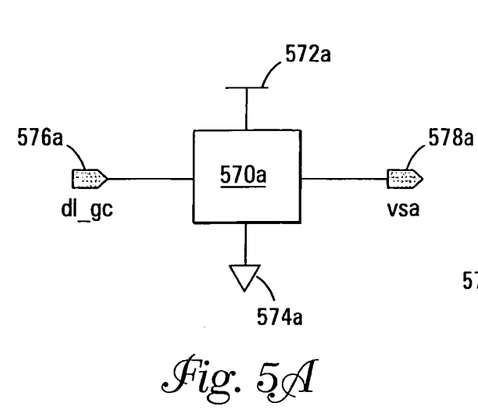
FIGS. 5A–5B are block diagrams of ground control circuits for use with various embodiments of the invention.
Figure 5B:
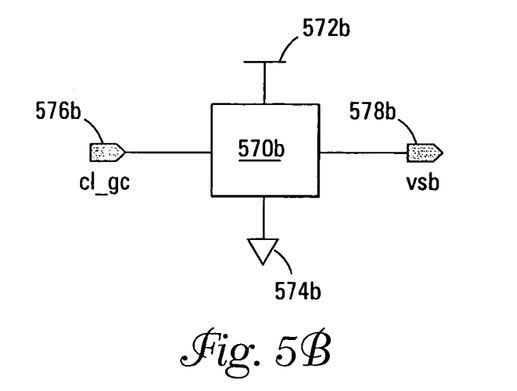

FIGS. 5A–5B are block schematics of ground control circuits for use in generating the variable potentials applied to the variable-potential nodes of the sensing devices in accordance with embodiments of the invention. Ground control circuit 570a is associated with a first latch, such as the data latch, while ground control circuit 570b is associated with a second latch, such as the cache latch. The ground control circuits 570a and 570b are adapted to provide the first and second, or intermediate, potentials to their variable-potential nodes. The first potential is preferably the ground potential Vss while the second potential is greater than the first potential and less than or equal to the supply potential Vcc. To avoid noise issues from the Vcc rail, it is generally preferred to provide some margin between the intermediate potential and the supply potential. For one embodiment, this margin is chosen as one Vt less than the supply potential, which is conveniently generated as described with reference to FIG. 7.

In FIG. 5A, ground control circuit 570a is coupled to receive a first potential, such as Vcc, at a supply potential node 572a, and to receive a second potential, such as Vss, at a ground potential node 574a. The ground control circuit 570a is responsive to a control signal, such as data latch ground control signal dl_gc, at node 576a. The ground control circuit 570a generates an output potential, such as potential vsa, at node 578a. Node 578a is coupled to each of the variable-potential nodes associated with the data latch of its associated sensing device. For the example sensing device of FIG. 4, node 578a is coupled to variable potential nodes 414, 422, 432 and 450.

In FIG. 5B, ground control circuit 570b is coupled to receive a first potential, such as Vcc, at a supply potential node 572b, and to receive a second potential, such as Vss, at a ground potential node 574b. The ground control circuit 570b is responsive to a control signal, such as cache latch ground control signal cl_gc, at node 576b. The ground control circuit 570b generates an output potential, such as potential vsb, at node 578b. Node 578b is coupled to each of the variable-potential nodes associated with the cache latch of its associated sensing device. For the example sensing device of FIG. 4, node 578b is coupled to variable potential nodes 438, 454 and 464.

Figure 6A:
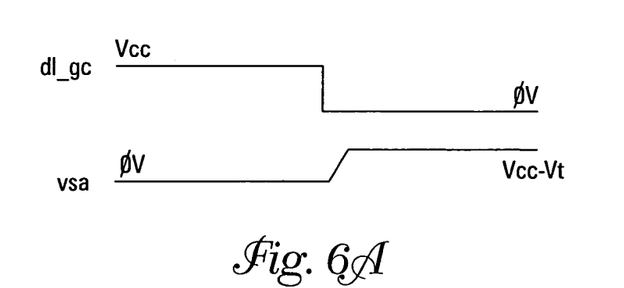
FIGS. 6A–6B are signal traces associated with the ground control circuits of FIGS. 5A–5B, respectively.
Figure 6B:
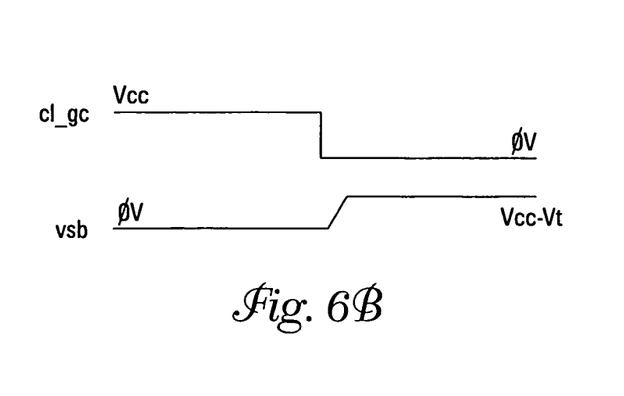

FIGS. 6A–6B are signal traces demonstrating the operational timing of the ground control circuits 570a and 570b, respectively. In FIG. 6A, the control signal dl_gc is maintained at a first logic level, such as Vcc, during a switching period of the data latch and is then transitioned to a second logic level, such as 0V, during a holding period of the data latch. In response to the control signal dl_gc, the output potential vsa goes from an initial potential, such as 0V, during the switching period of the data latch to a second potential, or the intermediate potential, such as Vcc-Vt, during the holding period of the data latch. In FIG. 6B, the control signal cl_gc is maintained at a first logic level, such as Vcc, during a switching period of the cache latch and is then transitioned to a second logic level, such as 0V, during a holding period of the cache latch. In response to the control signal cl_gc, the output potential vsb goes from an initial potential, such as 0V, during the switching period of the cache latch to a second potential, or the intermediate potential, such as Vcc-Vt, during the holding period of the cache latch. While the signal traces appear the same, it is noted that because the two latches operate independently and have switching/holding periods at different times, the outputs of the ground control circuits 570*a* and 570*b* will not necessarily be at the same potential level.

Figure 7:
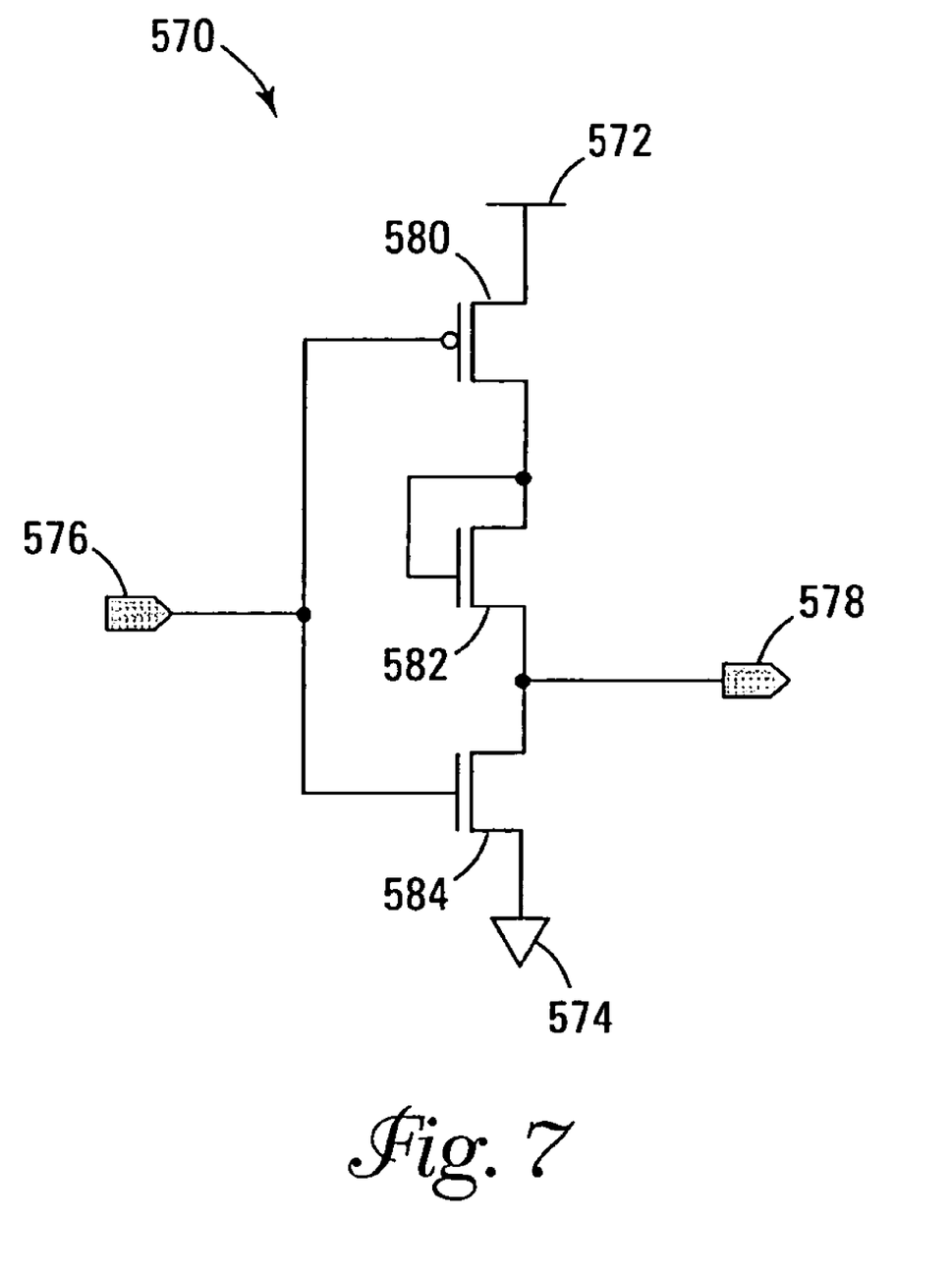
FIG. 7 is a schematic of one ground control circuit in accordance with an embodiment of the invention.

FIG. 7 is a schematic of one ground control circuit 570 for use with embodiments of the invention. As shown in FIG. 7, the ground control circuit is responsive to a control signal, such as dl_gc or cl_gc, received at node 576 and has an output node 578 for providing the first and intermediate potentials. The ground control circuit is coupled to receive the first potential at node 572 and the second potential at node 574. A pFET 580 has its control gate coupled to receive the control signal at node 576 and its source coupled to the potential node 572. A first nFET 582 has its gate and drain coupled to the drain of the pFET 580 and its source coupled to the output node 578. A second nFET 584 has its gate coupled to receive the control signal at node 576, its drain coupled to the output node 578 and its source coupled to the potential node 574. By applying a logic high to the node 576, the output node 578 will receive a potential of one Vt less than the potential applied to the potential node 572, e.g., Vcc-Vt. As described with reference to FIGS. 5A–5B, the output node 578 would be coupled to the variable-potential nodes associated with a latch as described herein. While more than one ground control circuit could be used for each latch, a ground control circuit should not be used for more than one latch in a given sensing device. While the schematic depicted in FIG. 7 represents one well-known circuit capable of producing a signal trace such as depicted in FIGS. 6A–6B, those skilled in the art will recognize that other circuits could be used to produce such signal traces.

CONCLUSION

Methods of sensing a programmed state of a nonvolatile memory cell, as well as apparatus for carrying out the methods, have been described herein for use in memory devices. Latches in sensing devices are selectively coupled to a variable-potential node to receive a first potential to switch the latch, i.e., presetting, setting or resetting the latch. After switching, the variable-potential node may be set to an intermediate potential to increase noise immunity to the latch while holding the data value. In NAND sensing devices having a data latch and a cache latch, the variable-potential nodes of the data latch and the variable-potential nodes of the cache latch are coupled to separate ground control circuits. By independently varying the potentials applied to the variable-potential nodes of the data latch and cache latch, determined by whether the individual latch is switching or holding data, noise immunity in the data path is increased.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory device, comprising:
an array of memory cell; and
control circuitry for access of the memory cells;
wherein the memory device is adapted to perform a method of sensing a target memory cell, the method comprising:
switching a first latch to a state indicative of a data value of the target memory cell while applying a first potential to first variable-potential nodes associated with switching the first latch;
applying a second potential to the first variable-potential nodes while holding the first latch in its state indicative of the data value;
switching a second latch to a state indicative of the state of the first latch and of the data value while applying a third potential to second variable-potential nodes associated with switching the second latch and while applying the second potential to the first variable-potential nodes; and
applying a fourth potential to the second variable-potential nodes while holding the second latch in its state indicative of the data value.

2. The memory device of claim 1, wherein the first potential is substantially equal to the third potential.

3. The memory device of claim 1, wherein the first potential is a ground potential.

4. The memory device of claim 3, wherein the second potential is greater than the ground potential and less than or equal to a supply potential.

5. The memory device of claim 4, wherein the second potential is approximately one Vt less than the supply potential.

6. The memory device of claim 1, wherein the third potential is a ground potential.

7. The memory device of claim 6, wherein the fourth potential is greater than the ground potential and less than or equal to a supply potential.

8. The memory device of claim 7, wherein the fourth potential is approximately one Vt less than the supply potential.

9. The memory device of claim 1, wherein the method further comprises:
applying the fourth potential to the second variable-potential nodes during at least a portion of a period of switching the first latch.

10. The memory device of claim 1, wherein the method further comprises:
passing the state of the second latch to an output driver while applying the fourth potential to the second variable-potential nodes;
applying the first potential to the first variable-potential nodes during at least a portion of a period of passing the state of the second latch; and
switching the first latch to a state indicative of a data value of a second target memory cell while applying the first potential to the first variable-potential nodes.

11. A memory device, comprising:
an array of memory cell; and
control circuitry for access of the memory cells;
wherein the memory device is adapted to perform a method of writing to a target memory cell, the method comprising:
applying a first potential to first variable-potential nodes associated with switching a first latch;
switching the first latch to a state indicative of a data value to be written to the target memory cell while applying the first potential to the first variable-potential nodes;

applying a second potential to the first variable-potential nodes while holding the first latch in its state indicative of the data value;

applying a third potential to second variable-potential nodes associated with switching a second latch;

switching the second latch to a state indicative of the state of the first latch and of the data value while applying the third potential to the second variable-potential nodes and while applying the second potential to the first variable-potential nodes;

applying a fourth potential to the second variable-potential nodes while holding the second latch in its state indicative of the data value; and coupling the second latch to a bit line coupled to the target memory cell while applying the fourth potential to the second variable-potential nodes.

12. The memory device of claim 11, wherein the first potential and the third potential are a ground potential.

13. The memory device of claim 12, wherein the second potential and the fourth potential are greater than the ground potential and less than or equal to a supply potential.

14. The memory device of claim 11, wherein the method further comprises:

applying the fourth potential to the second variable-potential nodes during at least a portion of a period of switching the first latch.

15. A memory device, comprising:

an array of memory cells; and a sensing device comprising two latches interposed between the array of memory cells and a driver circuit;

wherein the memory device is adapted to perform a method of passing data between the latches of the sensing device, the method comprising:

applying a first potential to first nodes associated with switching a first latch of the sensing device during a switching period of the first latch:

applying a second potential to the first nodes during a holding period of the first latch, wherein the second potential is greater than the first potential and less than a supply potential:

passing a state of the first latch to a second latch of the sensing device during the holding period of the first latch;

applying a third potential to second nodes associated with switching the second latch during a switching period of the second latch and while passing the state of the first latch to the second latch; and applying a fourth potential to the second nodes during a holding period of the second latch, wherein the fourth potential is greater than the third potential and less than the supply potential.

16. The memory device of claim 15, wherein the first potential is a ground potential and the second potential is approximately one Vt less than the supply potential.

17. The memory device of claim 15, wherein the third potential is substantially equal to the first potential and the fourth potential is substantially equal to the second potential.

18. The memory device of claim 15, wherein the holding period of the first latch is a different time period than the holding period of the second latch and wherein the switching period of the first latch is a different time period than the switching period of the second latch.

19. The memory device of claim 18, wherein the holding periods of the first and second latches overlap.

20. The memory device of claim 19, wherein the switching periods of the first and second latches do not overlap.

21. The memory device of of claim 15, wherein the passing of the data occurs during one of a data read or a data write operation of the memory device.

22. The memory device of of claim 15, wherein the first latch is selectively coupled to a select one of the target memory cell and the driver circuit, and the second latch is selectively coupled to a remaining one of the target memory cell and the driver circuit.

23. A sensing device, comprising:

a first latch for providing a first signal at a first node of the first latch and having a logic level indicative of a data value of a target memory cell, wherein the first latch is selectively coupled to one or more first variable-potential nodes for switching the first latch; and a second latch for providing a second signal at a first node of the second latch and having a logic level indicative of the data value, wherein the second latch is selectively coupled to one or more second variable-potential nodes for switching the second latch;

a first ground control circuit coupled to receive a first control signal and to provide a variable potential to the first variable-potential nodes responsive to the first control signal; and a second ground control circuit coupled to receive a second control signal and to provide a variable potential to the second variable-potential nodes responsive to the second control signal;

wherein at least one of the ground control circuits comprises:

a first n-type field-effect transistor having a control gate coupled to receive the control signal of that ground control circuit, a source coupled to receive a ground potential, and a drain coupled to an output node for providing the variable potential of that ground control circuit;

a p-type field-effect transistor having a control gate coupled to receive the control signal of that ground control circuit, a source coupled to receive a supply potential, and a drain; and a second n-type field-effect transistor having a control gate coupled to the drain of the p-type field-effect transistor, a source coupled to the drain of the first n-type field-effect transistor, and a drain coupled to the drain of the p-type field-effect transistor.

24. A memory device, comprising:

an array of memory cells; and a sensing device for sensing a data value of a target memory cell of the array of memory cells, the sensing device comprising:

a first latch for providing a first signal at a first node of the first latch and having a logic level indicative of the data value of the target memory cell, wherein the first latch is selectively coupled to one or more first variable-potential nodes for switching the first latch:

a second latch for providing a second signal at a first node of the second latch and having a logic level indicative of the data value, wherein the second latch is selectively coupled to one or more second variable-potential nodes for switching the second latch;

a first ground control circuit coupled to receive a first control signal and to provide a variable potential to the first variable-potential nodes responsive to the first control signal; and a second ground control circuit coupled to receive a second control signal and to provide a variable potential to the second variable-potential nodes responsive to the second control signal;

wherein the first ground control circuit and the second ground control circuit are adapted to provide the same potential levels, but independently of each other.

25. The memory device of claim 24, wherein each ground control circuit is coupled to receive the ground potential and the supply potential, and to provide its variable potential having either the ground potential or an intermediate potential between the ground potential and the supply potential.

26. The memory device of claim 25, wherein the intermediate potential is approximately one Vt less than the supply potential.

27. The memory device of claim 24, wherein at least one of the ground control circuits comprises:
   a first n-type field-effect transistor having a control gate coupled to receive the control signal of that ground control circuit, a source coupled to receive a ground potential, and a drain coupled to an output node for providing the variable potential of that ground control circuit;
   a p-type field-effect transistor having a control gate coupled to receive the control signal of that ground control circuit, a source coupled to receive a supply potential, and a drain; and
   a second n-type field-effect transistor having a control gate coupled to the drain of the p-type field-effect transistor, a source coupled to the drain of the first n-type field-effect transistor, and a drain coupled to the drain of the p-type field-effect transistor.

28. An electronic system, comprising:
   a processor; and
   a memory device coupled to the processor, wherein the memory device comprises:
      an array of memory cells; and
      a sensing device for sensing a data value of a target memory cell of the array of memory cells, the sensing device comprising:
         a first latch for providing a first signal at a first node of the first latch and having a logic level indicative of the data value of the target memory cell, wherein the first latch is selectively coupled to one or more first variable-potential nodes for switching the first latch;
         a second latch for providing a second signal at a first node of the second latch and having a logic level indicative of the data value, wherein the second latch is selectively coupled to one or more second variable-potential nodes for switching the second latch;
         a first ground control circuit coupled to receive a first control signal and to provide a variable potential to the first variable-potential nodes responsive to the first control signal; and
         a second ground control circuit coupled to receive a second control signal and to provide a variable potential to the second variable-potential nodes responsive to the second control signal;
         wherein at least one of the ground control circuits comprises:
            a first n-type field-effect transistor having a control gate coupled to receive the control signal of that ground control circuit, a source coupled to receive a ground potential, and a drain coupled to an output node for providing the variable potential of that ground control circuit;
            a p-type field-effect transistor having a control gate coupled to receive the control signal of that ground control circuit, a source coupled to receive a supply potential, and a drain; and
            a second n-type field-effect transistor having a control gate coupled to the drain of the p-type field-effect transistor, a source coupled to the drain of the first n-type field-effect transistor, and a drain coupled to the drain of the p-type field-effect transistor.

29. An electronic system, comprising:
   a processor; and
   a memory device coupled to the processor, wherein the memory device comprises:
      an array of memory cell; and
      control circuitry for access of the memory cells;
      wherein the memory device is adapted to perform a method of sensing a target memory cell, the method comprising:
         switching a first latch to a state indicative of a data value of the target memory cell while applying a first potential to first variable-potential nodes associated with switching the first latch;
         applying a second potential to the first variable-potential nodes while holding the first latch in its state indicative of the data value;
         switching a second latch to a state indicative of the state of the first latch and of the data value while applying a third potential to second variable-potential nodes associated with switching the second latch and while applying the second potential to the first variable-potential nodes; and
         applying a fourth potential to the second variable-potential nodes while holding the second latch in its state indicative of the data value.

30. The electronic system of claim 29, wherein the first potential and the third potential are a ground potential and wherein the second potential and the fourth potential greater than the ground potential and less than or equal to a supply potential.

31. The electronic system of claim 30, wherein the second potential and the fourth potential are approximately one Vt less than the supply potential.

32. The electronic system of claim 29, wherein the method further comprises:
   applying the fourth potential to the second variable-potential nodes during at least a portion of a period of switching the first latch.

33. The electronic system of claim 29, wherein the method further comprises:
   passing the state of the second latch to an output driver while applying the fourth potential to the second variable-potential nodes;
   applying the first potential to the first variable-potential nodes during at least a portion of a period of passing the state of the second latch; and
   switching the first latch to a state indicative of a data value of a second target memory cell while applying the first potential to the first variable-potential nodes.

34. An electronic system, comprising:
   a processor; and
   a memory device coupled to the processor, wherein the memory device comprises:
      an array of memory cell; and
      control circuitry for access of the memory cells;
      wherein the memory device is adapted to perform a method of writing to a target memory cell, the method comprising:

applying a first potential to first variable-potential nodes associated with switching a first latch;

switching the first latch to a state indicative of a data value to be written to the target memory cell while applying the first potential to the first variable-potential nodes;

applying a second potential to the first variable-potential nodes while holding the first latch in its state indicative of the data value;

applying a third potential to second variable-potential nodes associated with switching a second latch;

switching the second latch to a state indicative of the state of the first latch and of the data value while applying the third potential to the second variable-potential nodes and while applying the second potential to the first variable-potential nodes;

applying a fourth potential to the second variable-potential nodes while holding the second latch in its state indicative of the data value; and coupling the second latch to a bit line coupled to the target memory cell while applying the fourth potential to the second variable-potential nodes.

35. The electronic system of claim 34, wherein the first potential and the third potential are a ground potential and wherein the second potential and the fourth potential are greater than the ground potential and less than or equal to a supply potential.

36. The electronic system of claim 34, wherein the method further comprises:

applying the fourth potential to the second variable-potential nodes during at least a portion of a period of switching the first latch.

37. An electronic system, comprising:

a processor; and a memory device coupled to the processor, wherein the memory device comprises:

an array of memory cells; and a sensing device comprising two latches interposed between the array of memory cells and a driver circuit;

wherein the memory device is adapted to perform a method of passing data between the latches of the sensing device during either a data read operation or a data write operation, the method comprising:

applying a first potential to first nodes associated with switching a first latch of the sensing device during a switching period of the first latch;

applying a second potential to the first nodes during a holding period of the first latch, wherein the second potential is greater than the first potential and less than a supply potential; and passing a state of the first latch to a second latch of the sensing device during the holding period of the first latch; and wherein the method further comprises:

applying a third potential to second nodes associated with switching the second latch during a switching period of the second latch and while passing the state of the first latch to the second latch; and applying a fourth potential to the second nodes during a holding period of the second latch, wherein the fourth potential is greater than the third potential and less than the supply potential.

38. The electronic system of claim 37, wherein the first potential is a ground potential and the second potential is approximately one Vt less than the supply potential.

39. The electronic system of claim 37, wherein the third potential is substantially equal to the first potential and the fourth potential is substantially equal to the second potential.

40. The electronic system of claim 37, wherein the holding period of the first latch is a different time period than the holding period of the second latch and wherein the switching period of the first latch is a different time period than the switching period of the second latch.

41. The electronic system of claim 40, wherein the holding periods of the first and second latches overlap and wherein the switching periods of the first and second latches do not overlap.

42. The electronic system of claim 37, wherein the first latch is selectively coupled to a select one of the target memory cell and the driver circuit, and the second latch is selectively coupled to a remaining one of the target memory cell and the driver circuit.

43. A method of sensing a target memory cell, comprising:

switching a first latch to a state indicative of a data value of the target memory cell while applying a first potential to first variable-potential nodes associated with switching the first latch;

applying a second potential to the first variable-potential nodes while holding the first latch in its state indicative of the data value;

switching a second latch to a state indicative of the state of the first latch and of the data value while applying a third potential to second variable-potential nodes associated with switching the second latch and while applying the second potential to the first variable-potential nodes; and applying a fourth potential to the second variable-potential nodes while holding the second latch in its state indicative of the data value.

44. The method of claim 43, wherein the first potential and the third potential are a ground potential and wherein the second potential and the fourth potential are greater than the ground potential and less than or equal to a supply potential.

45. The method of claim 44, wherein the second potential and the fourth potential are approximately one Vt less than the supply potential.

46. The method of claim 43, further comprising:

applying the fourth potential to the second variable-potential nodes during at least a portion of a period of switching the first latch.

47. The method of claim 43, further comprising:

passing the state of the second latch to an output driver while applying the fourth potential to the second variable-potential nodes;

applying the first potential to the first variable-potential nodes during at least a portion of a period of passing the state of the second latch; and switching the first latch to a state indicative of a data value of a second target memory cell while applying the first potential to the first variable-potential nodes.

* * * * *